United States Patent
Karpov et al.

(10) Patent No.: US 11,233,040 B2
(45) Date of Patent: Jan. 25, 2022

(54) INTEGRATION OF HIGH DENSITY CROSS-POINT MEMORY AND CMOS LOGIC FOR HIGH DENSITY LOW LATENCY ENVM AND EDRAM APPLICATIONS

(71) Applicant: Intel Corporation, Santa Clara, CA (US)

(72) Inventors: Elijah V. Karpov, Portland, OR (US); Prashant Majhi, San Jose, CA (US); Brian S. Doyle, Portland, OR (US); Ravi Pillarisetty, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 16/629,915

(22) PCT Filed: Sep. 25, 2017

(86) PCT No.: PCT/US2017/053309
§ 371 (c)(1),
(2) Date: Jan. 9, 2020

(87) PCT Pub. No.: WO2019/059952
PCT Pub. Date: Mar. 28, 2019

(65) Prior Publication Data
US 2020/0357782 A1 Nov. 12, 2020

(51) Int. Cl.
*H01L 23/48* (2006.01)
*H01L 25/18* (2006.01)
(Continued)

(52) U.S. Cl.
CPC .............. *H01L 25/18* (2013.01); *H01L 24/08* (2013.01); *H01L 24/80* (2013.01);
(Continued)

(58) Field of Classification Search
None
See application file for complete search history.

(56) References Cited

U.S. PATENT DOCUMENTS 5,818,114 A * 10/1998 Pendse ................... H01L 24/85
257/786
6,150,724 A * 11/2000 Wenzel ............... H01L 25/0657
257/724
(Continued)

FOREIGN PATENT DOCUMENTS

WO  WO-2019-005019  1/2019
WO  WO-2019005019  1/2019

OTHER PUBLICATIONS

International Preliminary Report on Patentability for International Patent Application No. PCT/US2017/053309 dated Apr. 9, 2020, 8 pgs.
(Continued)

*Primary Examiner* — Hung K Vu
(74) *Attorney, Agent, or Firm* — Schwabe, Williamson & Wyatt, P.C.

(57) ABSTRACT

An embedded cross-point memory array is described. In an example, an integrated circuit structure includes a first die including a cross-point memory array comprising separate memory blocks, the memory blocks including orthogonally arranged conductive lines, and memory elements at cross-sections of the conductive lines. A first plurality of sockets is on the first die adjacent to the memory blocks, the first plurality of sockets comprising a first plurality of pads that connect to at least a portion to the conductive lines of the corresponding memory block. A second die includes logic circuitry and a second plurality of sockets comprising a second plurality of pads at least partially aligned with positions of the first plurality of pads on the first die. A top of the first die and a top of the second die face one another,
(Continued)

wherein the first plurality of pads are bonded with the second plurality pads to directly connect the cross-point memory array to the logic circuitry.

25 Claims, 9 Drawing Sheets

(51) Int. Cl.
  *H01L 23/00* (2006.01)
  *H01L 25/065* (2006.01)
  *H01L 25/00* (2006.01)
(52) U.S. Cl.
  CPC .......... *H01L 25/0657* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/1434* (2013.01)

(56) References Cited

U.S. PATENT DOCUMENTS

| | | | |
|---|---|---|---|
| 8,885,382 B2 | 11/2014 | Pellizzer et al. | |
| 2002/0192895 A1* | 12/2002 | Taussig | H01L 25/105 438/237 |
| 2006/0126369 A1* | 6/2006 | Raghuram | B82Y 10/00 365/51 |
| 2009/0036070 A1* | 2/2009 | Rofougaran | H01L 25/18 455/126 |
| 2010/0271862 A1* | 10/2010 | Yoon | G11C 11/1673 365/148 |

OTHER PUBLICATIONS

International Search Report and Written Opinion for International Patent Application No. PCT/US2017/053309 dated Jun. 25, 2018, 11 pgs.

* cited by examiner

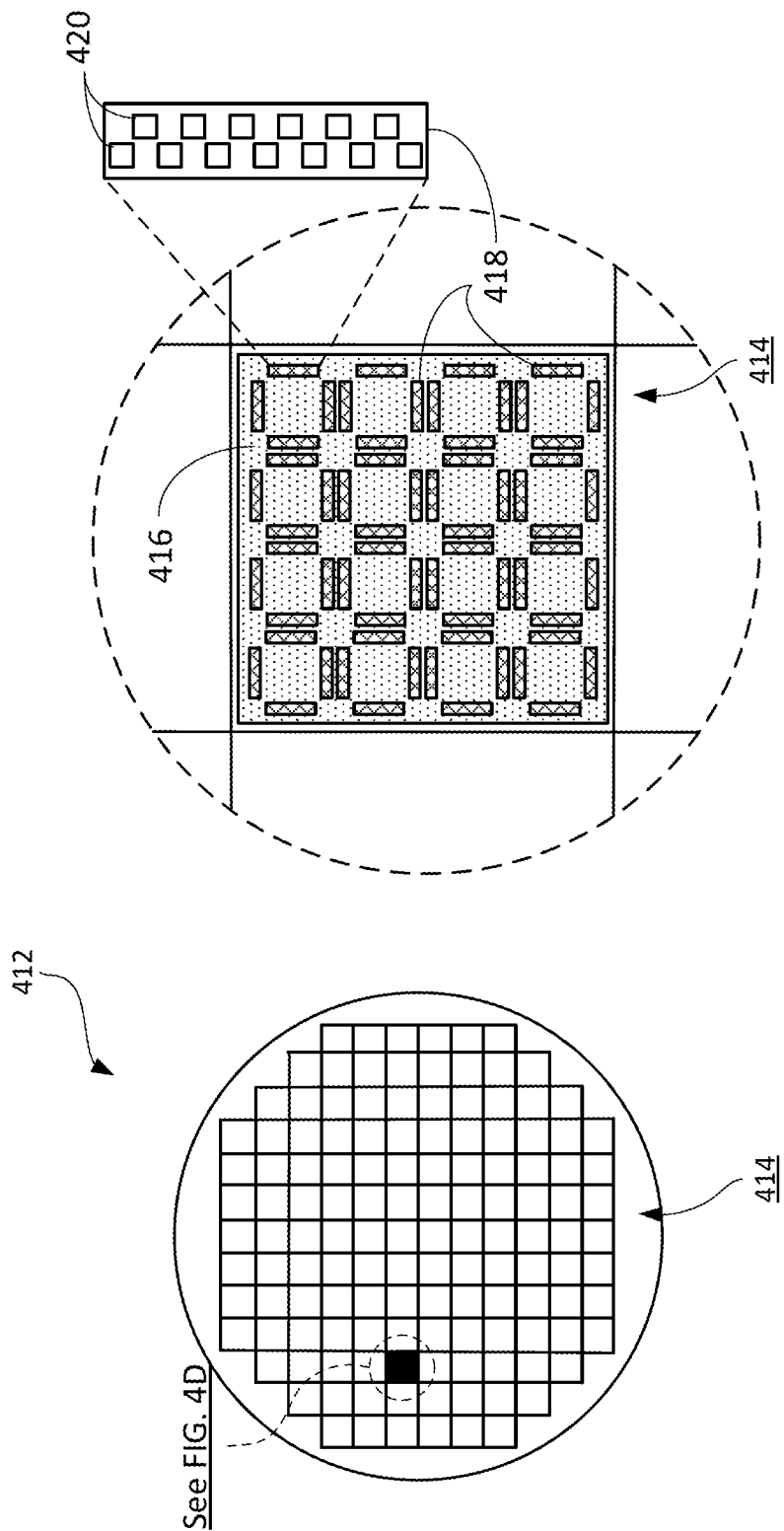

INTEGRATION OF HIGH DENSITY CROSS-POINT MEMORY AND CMOS LOGIC FOR HIGH DENSITY LOW LATENCY ENVM AND EDRAM APPLICATIONS

CROSS-REFERENCE TO RELATED APPLICATION

This patent application is a U.S. National Phase Application under 35 U.S.C. § 371 of International Application No. PCT/US2017/053309, filed Sep. 25, 2017, entitled "INTEGRATION OF HIGH DENSITY CROSS-POINT MEMORY AND CMOS LOGIC FOR HIGH DENSITY LOW LATENCY ENVM AND EDRAM APPLICATIONS," which designates the United States of America, the entire disclosure of which is hereby incorporated by reference in its entirety and for all purposes.

TECHNICAL FIELD

Embodiments of the disclosure are in the field of integrated circuit structures and, in particular, integration of high density cross-point memory and CMOS logic for high density low latency eNVM and eDRAM applications.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Nonvolatile memory based on resistance change, known as RRAM/ReRAM, typically operates at voltages greater than 1V, typically requires a high voltage (>1V) forming step to form a filament, and typically have high resistance values limiting read performance. For low voltage non-volatile embedded applications, operating voltages less than 1V and compatible with CMOS logic processes may be desirable or advantageous.

Variability in conventional and state-of-the-art fabrication processes may limit the possibility to further extend such processes into the, e.g. 10 nm or sub-10 nm range. Consequently, fabrication of the functional components needed for future technology nodes may require the introduction of new methodologies or the integration of new technologies in current fabrication processes or in place of current fabrication processes.

Thus, significant improvements are still needed in the area of nonvolatile device manufacture and operation.

BRIEF DESCRIPTION OF THE DRAWINGS

FIGS. 4A through 4D are top views of a wafer and dies in accordance with one or more of embodiments disclosed herein.

DESCRIPTION OF THE EMBODIMENTS

Figure 1:
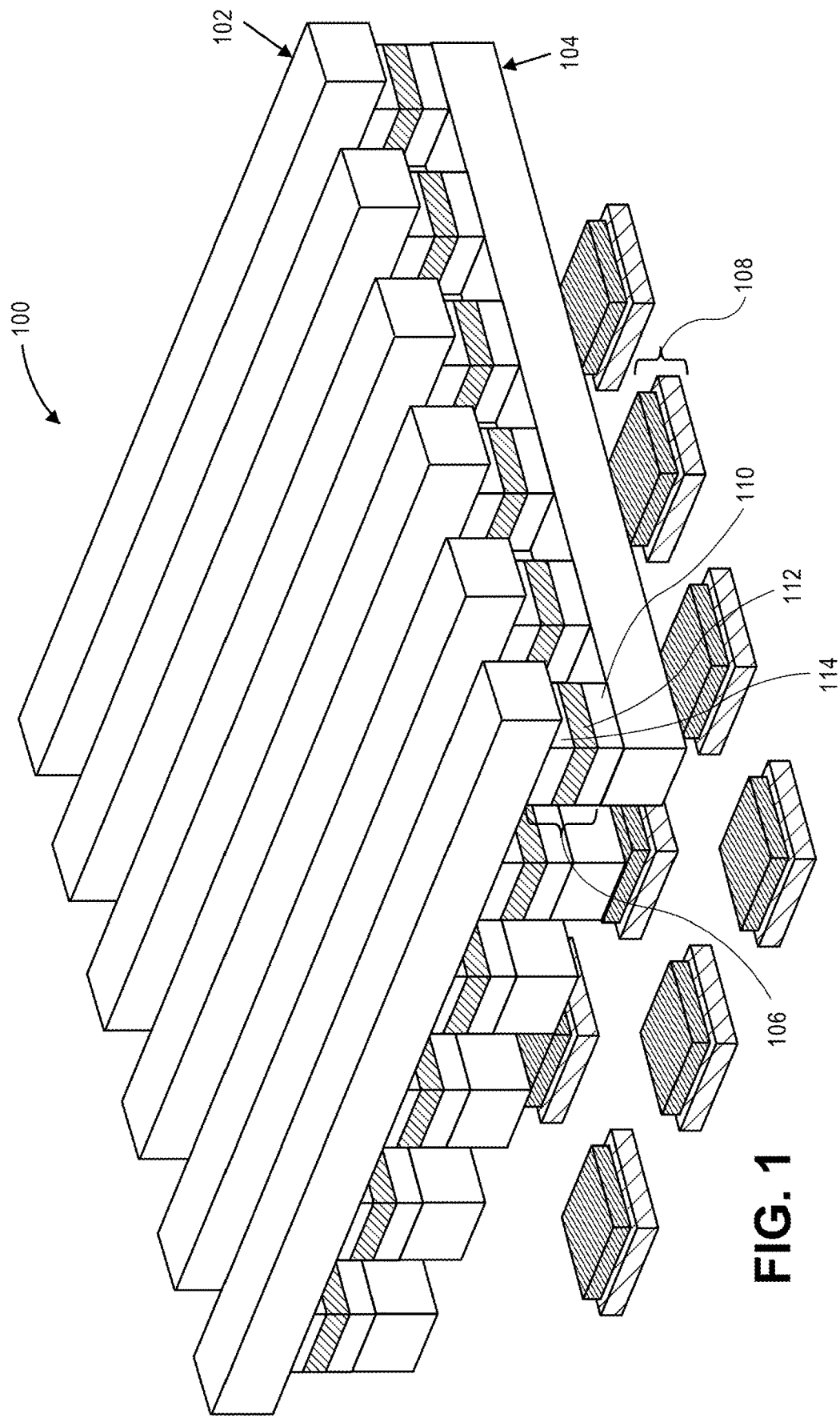
FIG. 1 illustrates an angled three-dimensional view of a first cross-point memory array, in accordance with an embodiment of the present disclosure.

Integration of high density cross-point memory and CMOS logic for high density low latency eNVM and e DRAM applications, are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to integration of high density cross-point memory and CMOS logic to provide embedded cross-point memory. Such embodiments may have applications for one or more of cross-point memory, embedded memory, memory, memory arrays, embedded transistor-less cross-point memory arrays, and ferroelectric memory.

To provide context, state-of-the-art embedded memories and ferroelectric memories have large bit cell size, e.g., typically greater than 9F2. Also, state-of-the-art memories require a transistor in series with a memory. The transistor device occupies valuable silicon real estate of the wafer. Custom front end of line (FEOL) processes are typically required to fabricate the transistor (1T) of a 1T-1C bit cell. Additionally, limited scaling of array periphery can inhibit some of the benefits of such memory arrays.

In accordance with an embodiment of the present disclosure, a transistor-less array, e.g. with 4F2 or less density, is fabricated based on backend of line (BEOL) ferroelectric material. The cross-point array may include a memory element located at a cross-section of each bit line and word line. The approach may provide the most dense memory architecture possible, a cross point, with the least number of devices possible at each cross-point, i.e., only one device. Typically there are two devices at each cross-section, e.g., a selector device and a memory device.

As a first example, FIG. 1 illustrates an angled three-dimensional view of a first cross-point memory array, in accordance with an embodiment of the present disclosure.

Referring to FIG. 1, an integrated circuit structure 100 includes a first plurality of conductive lines 104 along a first direction above a substrate. In an embodiment, the first plurality of conductive lines 104 is a plurality of bit-lines. A plurality of memory elements 106 is on individual ones of the first plurality of conductive lines 104. Individual ones of the plurality of memory elements 106 include a bottom electrode 110, a memory and selector material stack 112 on the bottom electrode 110, and a top electrode 114 on the ferroelectric oxide material 112. A second plurality of conductive lines 102 is on the plurality of memory elements 106. In an embodiment, the second plurality of conductive lines 102 is a plurality of word lines. The second plurality of conductive lines 102 is along a second direction orthogonal to the first direction. In an embodiment, the first plurality of conductive lines 104 is above and coupled to a plurality of selector devices 108 above the substrate.

In an embodiment, individual ones of the plurality of memory elements 106 have a length along the first direction approximately the same as a length along the second direction, as is depicted. In an embodiment, the bottom electrode 110 and the top electrode 114 are each composed of a material comprising metal or metal nitrides e.g., titanium nitride, tantalum nitride, tungsten, palladium and platinum. In one such embodiment, the bottom electrode 110 and the top electrode 114 may comprise the same material.

Figure 2:
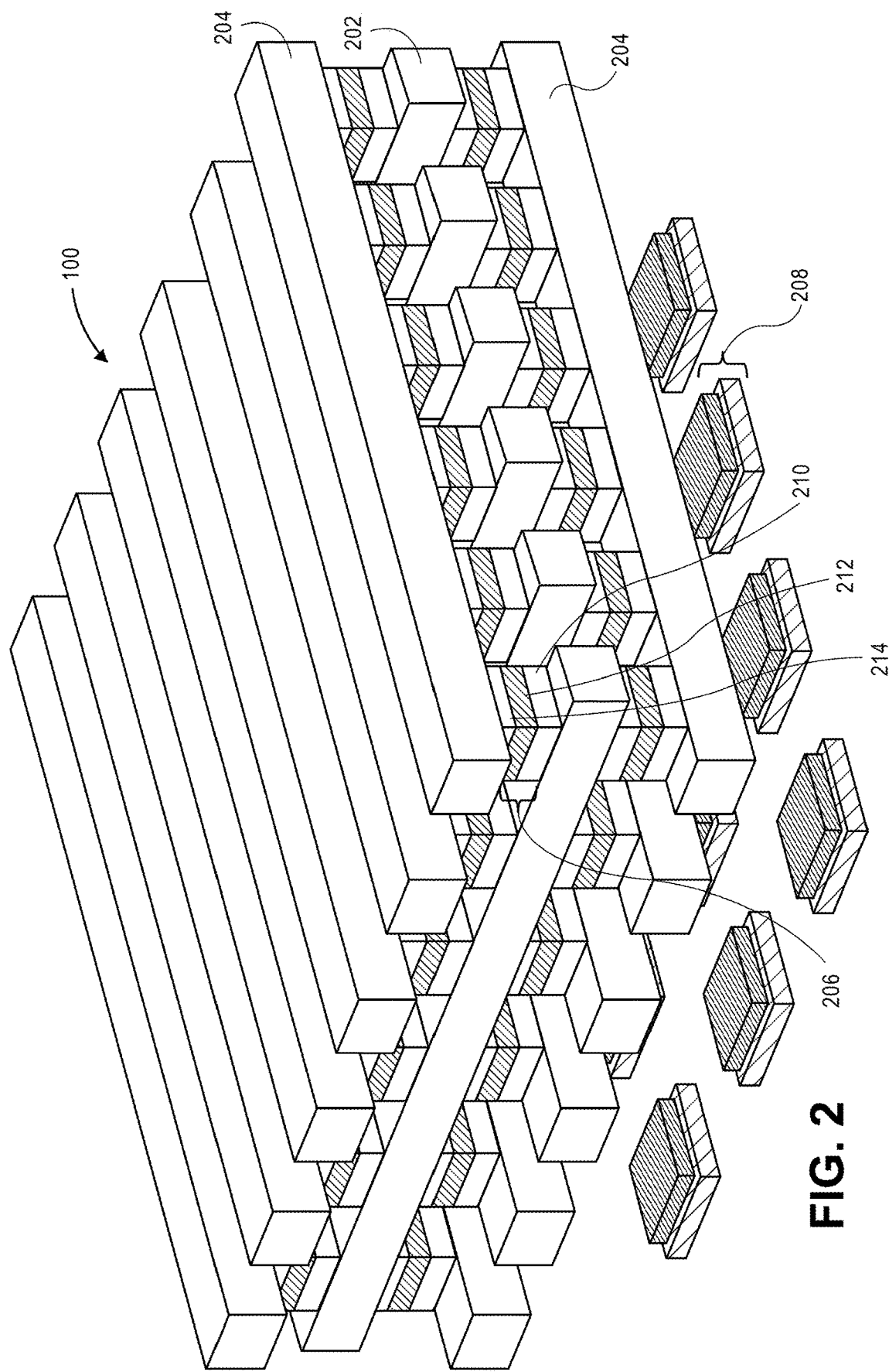
FIG. 2 illustrates an angled three-dimensional view of a stacked cross-point memory array, in accordance with another embodiment of the present disclosure.

As a second example, FIG. 2 illustrates an angled three-dimensional view of a stacked cross-point memory array, in accordance with another embodiment of the present disclosure.

Referring to FIG. 2, an integrated circuit structure 200 includes a first plurality of conductive lines (bottom 204) along a first direction above a substrate. A first plurality of memory elements (bottom 206) is on individual ones of the first plurality of conductive lines (bottom 204). In an embodiment, the first plurality of conductive lines (bottom 204) is a first plurality of bit-lines. In an embodiment, the first plurality of conductive lines (bottom 204) is above and coupled to a plurality of selector devices 208 above the substrate. Individual ones of the first plurality of memory elements (bottom 206) may include a bottom electrode 210, a ferroelectric oxide material 212 on the bottom electrode 210, and a top electrode 214 on the ferroelectric oxide material 212. A second plurality of conductive lines 202 is on the first plurality of memory elements (bottom 206). The second plurality of conductive lines 202 is along a second direction orthogonal to the first direction. A second plurality of memory elements (top 206) is on individual ones of the second plurality of conductive lines 202. In an embodiment, the second plurality of conductive lines 202 is a plurality of word lines. Individual ones of the second plurality of memory elements (top 206) include the bottom electrode 210, the ferroelectric oxide material 212 on the bottom electrode 210, and the top electrode 214 on the ferroelectric oxide material 212. In an embodiment, the second plurality of memory elements (top 206) is in vertical alignment with the first plurality of memory elements (bottom 206), as is depicted. A third plurality of conductive lines (top 204) is on the second plurality of memory elements (top 206) along the first direction. In an embodiment, the third plurality of conductive lines (top 204) is a first plurality of bit-lines.

In an embodiment, individual ones of the first and second pluralities of memory elements 206 have a length along the first direction approximately the same as a length along the second direction, as is depicted.

Figure 3:
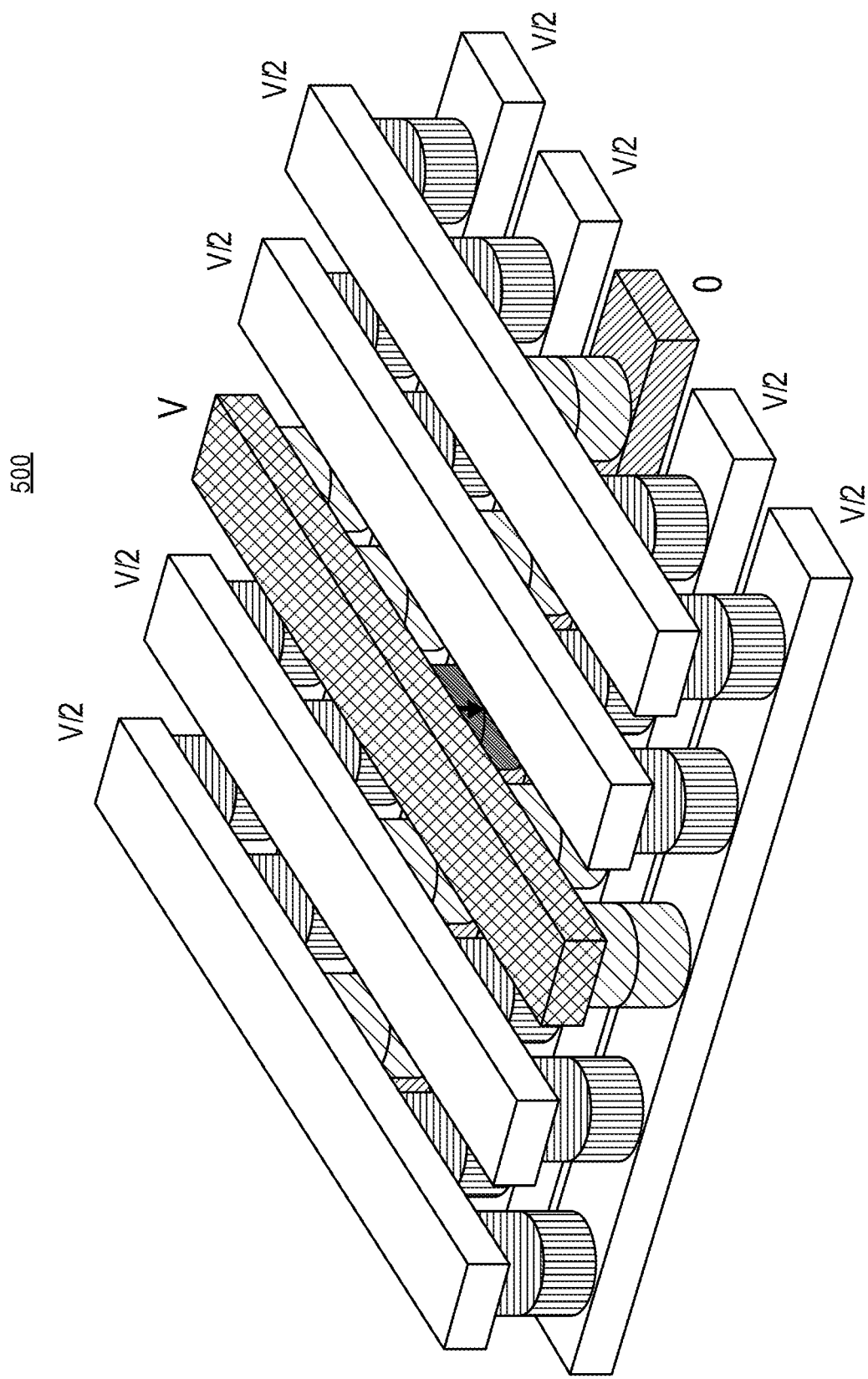
FIG. 3 illustrates an angled three-dimensional view of a cross-point memory array in V/2 operation mode, in accordance with an embodiment of the present disclosure.

As an exemplary cross-point memory operation, FIG. 3 illustrates an angled three-dimensional view of a cross-point memory array 300 in operation, in accordance with an embodiment of the present disclosure.

Referring to FIG. 3, in an embodiment, a basic operation involves, at a read operation, when for a bit in state "1", in contrast to a bit in state "0", a polarization change occur when bit-line voltage is changed from −/+V to +/−V polarity. The change, equivalent of discharging of capacitor of approximately 15fF, lead to a current which can be sensed. In an embodiment, such as destructive read involves the use of a write-after-read circuit. In the example shown, 0 values for a bit-line and corresponding word line select the central memory element of FIG. 3.

To provide further context, integrating memory directly onto a microprocessor chip may be advantageous since it enables higher operation speeds compared to having physically separate logic and memory chips. Unfortunately, traditional charge-based memory technologies such as DRAM and NAND Flash are now facing severe scalability issues related to increasingly precise charge placement and sensing requirements. Current high density embedded nonvolatile memory is not available. Both SSTM and RRAM (resistive random-access memory) embedded NV memories have been demonstrated in only megabytes, not gigabyte densities, which would be required for integrating memory directly onto a microprocessor chip.

The cross-point memory arrays disclosed herein have DRAM like performance, but require an intervening interface, such as a DIMM (dual in-line memory module) to be connected to a processor. For example, if DDR4 (double data rate fourth-generation synchronous dynamic random-access memory) is used as an interface between a cross-point memory array and a processor, the connection speed and latency is still limited by the DDR4 interface and significantly lower than for embedded memory. Also, chalcogenides materials used in cross-point memory arrays cannot be fabricated using in the same fabrication process used for logic circuitry because of higher than 1V voltages used for cross-point array operation. Also the temperatures used in the backend process during logic fabrication may be too high for chalcogenide materials.

As an alternative, embedded EDRAM could be used, which are typically implemented in 1T-1C architectures in which one transistor selects one capacitor. However, 1T-1C type memories are not as dense as cross-point memory arrays and 1T-1C memories cannot be stacked in silicon to enable gigabyte densities.

According to the embodiments disclosed herein, an integrated circuit structure is provided that integrates cross-point memory and logic circuitry to provide embedded cross-point memory having high density and low latency. According to one embodiment, a wafer or die comprising a cross-point memory array is integrated with a different type of wafer or die comprising logic circuitry, such as a processor, to create an embedded cross-point memory even though fabrication processes and pitches of the two different wafers are significantly different.

As an example of an apparatus that may include one or more of the integrated circuit structures disclosed herein, FIGS. 4A through 4D are top views of a wafer and dies in accordance with one or more of embodiments disclosed herein.

Figure 4B:
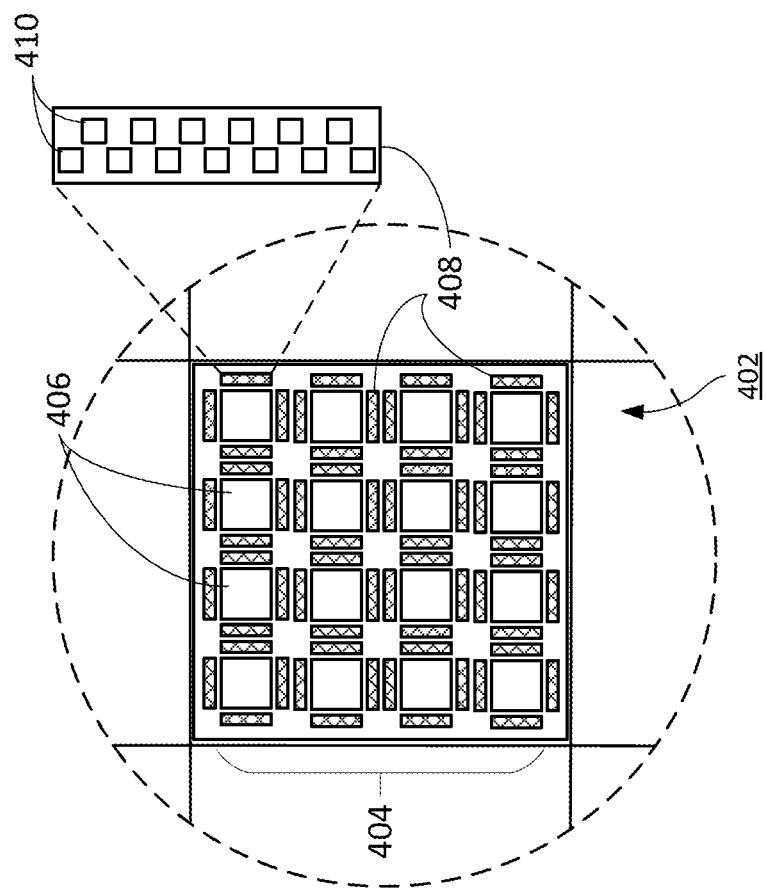
Figure 4A:
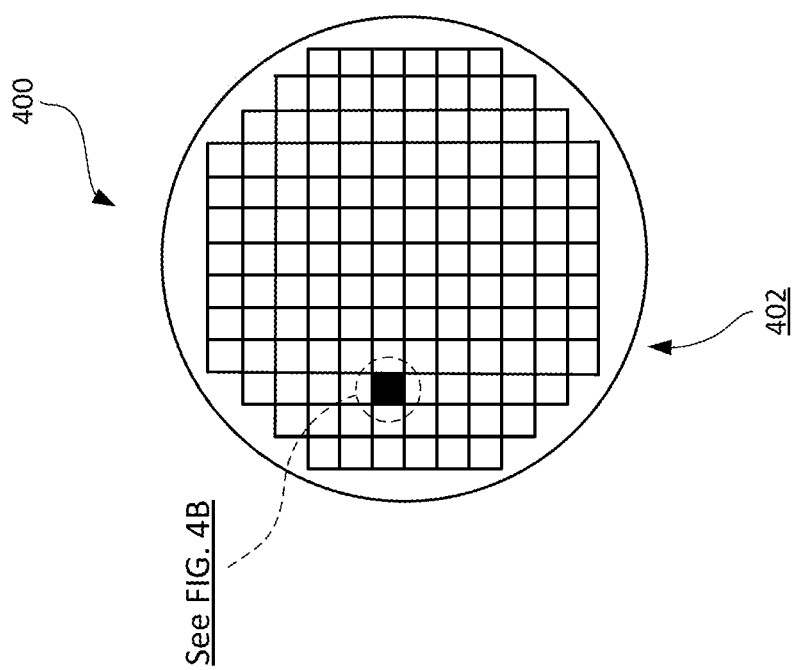

Referring to FIGS. 4A and 4C, a first wafer 400 and a second wafer 412 may be composed of semiconductor material and may include one or more dies 402, 414 having integrated circuit (IC) structures formed on a top surface of the wafers 400, 412. In one embodiment, the first wafer 400 includes a cross-point memory array 404, and the second wafer 412 includes logic circuitry 416. Each of the dies 402, 414 may be a repeating unit of a semiconductor product that includes any suitable IC, e.g., ICs including one or more structures such as cross-point memory arrays 100 or 200. After the fabrication of the semiconductor product is complete the wafer 400, 412 may undergo a singulation process in which each of the dies 402 is separated from one another to provide discrete "chips" of the semiconductor product. In particular, devices that include integrated circuit structures as disclosed herein may take the form of one or more wafers 400m 412 (e.g., not singulated) or the form of one or more die 402, 414 (e.g., singulated). The die 402, 414 may include supporting circuitry to route electrical signals to the transistors, as well as any other IC components. In some embodiments, the wafer 400, 412 or the die 402 may also include a memory device (e.g., a static random access memory (SRAM) device), a logic device (e.g., an AND, OR, NAND, or NOR gate), or any other suitable circuit element. Multiple ones of these devices may be combined on a single die 402. For example, a memory array formed by multiple memory devices may be formed on a same die 402 as a processing device or other logic that is configured to store information in the memory devices or execute instructions stored in the memory array.

Figure is 4B is top view of a die 402 of the first wafer 400 that in one embodiment includes a cross-point memory array 404 However, in accordance with a further aspect of the disclosed embodiments, the cross-point memory array 404 is segmented into a plurality of separate and spaced apart memory blocks 406. The separate memory blocks 406 have a structure similar to the cross-point memory arrays of FIGS. 1 and 2, which include orthogonally arranged conductive lines 204 (e.g., word lines and bit lines), and memory elements at cross-sections of the conductive lines 204.

Figure is 4D is top view of a die 414 of the second wafer 412 that in one embodiment includes logic circuitry 416. For example, the logic circuitry 416 may comprise CMOS logic, including one or more processors.

Referring to FIGS. 4AB and 4D, in order to create an embedded cross-point memory, a first plurality of sockets 408 are provided on the first die 402 adjacent to sides of the memory blocks 406 comprising the cross-point memory array 404; and a second plurality of sockets 418 are provided on the second die 414 interspersed among the logic circuitry 416. Referring to FIG. 4B, the first plurality of sockets 408 comprise a first plurality of pads 410 that connect to at least a portion of the conductive lines 204 of a corresponding memory block 404. Referring to FIG. 4D, the second die 414, which includes logic circuitry 416, has a second plurality sockets 418 comprising a second plurality of pads 420 that align, or at least partially align, with position of the first plurality of pads 406 on the first die 402.

Figure 5A:
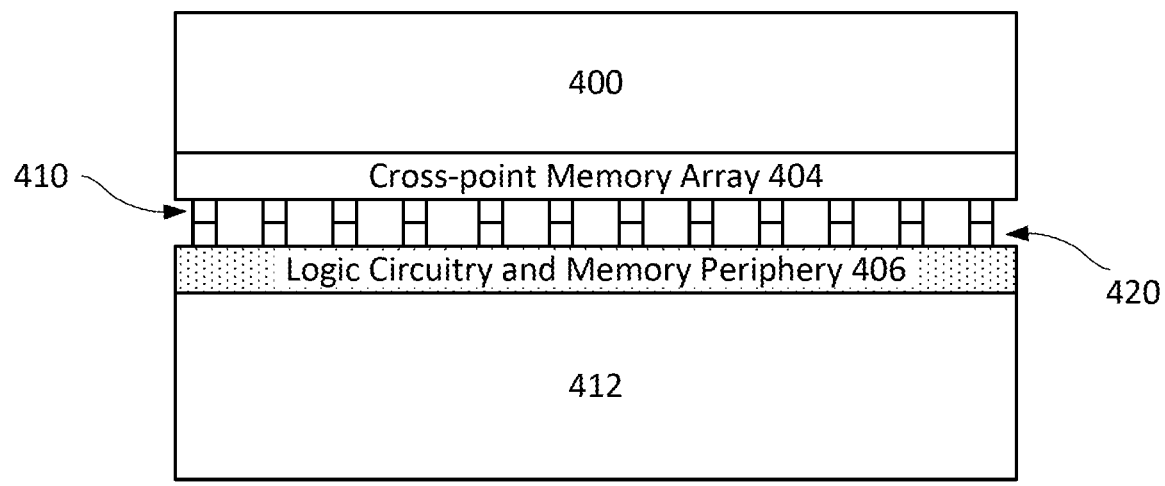
FIGS. 5A and 5B are cross-sectional views of an embedded cross-point memory array comprising first and second wafers.
Figure 5B:
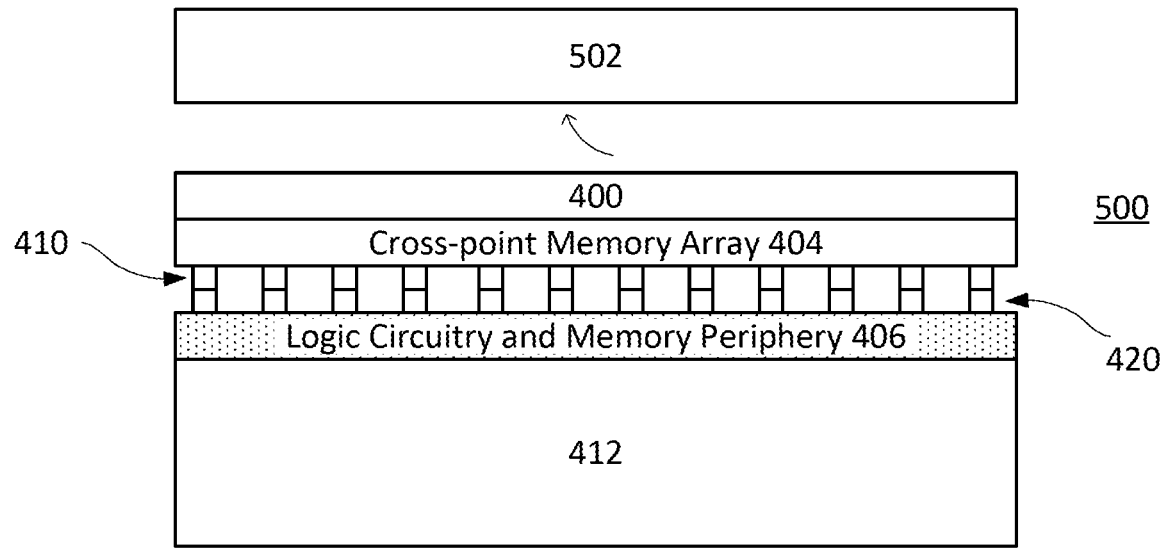

FIGS. 5A and 5B are cross-sectional views of an embedded cross-point memory array 500 comprising the first and second die 402 and 414. FIG. 5A shows that one of the wafers 400, 412 has been flipped such that a top of the first wafer 400 and a top of the second wafer 412 face one another. The first plurality of pads 410 are bonded with the second plurality of pads 420 to directly connect the cross-point memory array 404 to the logic circuitry 416 to form the embedded cross point memory array 500.

In one embodiment, the first wafer 400 in which the cross-point memory array 404 is formed, may be approximately 700 µm thick. For some applications, a wafer with such excess material may be unnecessary and undesirable. FIG. 5B shows that in a further embodiment, the excess material in the first wafer 400 may be removed to create a carrier wafer 502. The carrier wafer 502 may then be reused to pattern another cross-point memory array, and the process may be repeated. In one embodiment, silicon on insulator (SOI) technology may be used for this purpose. Reusing excess material from the first wafer 400 to create one or more carrier wafers 502 significantly reduces the cost of fabrication. The process also results in the first wafer 400 having significantly less thickness, which may result in a smaller package size for the embedded cross-point memory array 500.

Referring again to FIG. 4B, as stated above, each of the separate memory blocks 406 comprising the cross-point memory array 404 include conductive lines 204 comprising word lines and bit lines, and memory elements at cross-sections of the word lines and bit lines. It is to be understood that each of memory blocks 406 comprise a plurality of individual memory bit cells and each of the memory bit cells may further include additional read and write circuitry (not shown), a sense amplifier (not shown), a bit line reference (not shown), and the like. For example, respective transistors drive the word lines and bit lines with voltages to operate the cross-point array. These components are located in a periphery area outside of, and adjacent to, the memory blocks 406. Referring to FIG. 4D, the sockets 408 refer to areas within the periphery of the first wafer 400 in which the pads 410 are also located. Similarly, referring to FIG. 4D, the sockets 418 refer to areas within the periphery of the second wafer 412 in which the pads 420 are located, except the periphery of the second wafer 412 can be interspersed with the logic circuitry 416.

According to one embodiment, a cross-point memory array efficiency of greater than 50% is achieved as follows. The amount a memory in each memory block 406 is calculated by the number of word lines (N) times the number of bit lines (M) so that the memory blocks 406 comprise N×M memory elements. In one embodiment, N=M, providing square memory blocks 406. In one embodiment, the number of word lines (N) and the number of bit lines (M) is 50, resulting in 50×50 memory block sizes. The total area for each memory block 406 is calculated as pitch2×N2, where the pitch is the distance between successive word lines and/or bit lines. The array socket area is calculated as pitch×N. In one embodiment, the pitch of each memory block 406 may range from approximately 14 nm to 50 nm.

With conventional processes, directly attaching a wafer 400 having a pitch of less than 50 nm in a memory array to another wafer is not possible due to misalignment issues. However, through the use of separate memory blocks 406 and associated sockets 408, the wafer 400 with very dense memory blocks 406 is attachable to a second wafer 412 because the pads 410 one the wafer 400 are spaced at a pitch significantly greater than a pitch of the memory blocks 406. That is, the wafer 400 having very dense memory blocks is attachable to a second wafer 412 when the pitch of the sockets 408 on the first wafer 400 matches the pitch of the logic circuitry 416 and the pitch of the pads 420 on the second wafer 412. In one embodiment, the pitch of the logic circuitry 416 on the second wafer 412 is at least one micron (1 μm). Accordingly, the pitch of the pads 410 in the sockets 408 on the first wafer 400 is also at least one micron. Bonding between the sockets 408 on the first wafer 400 and the sockets 418 on the second wafer 412 is now made possible because the positions of the pads 420 in the sockets 418 on the second wafer 412 align with positions the pads 410 in the sockets 408 on the first wafer 400 and both sets of pads 410, 420 have matching pitches of at least one micron.

According to the disclosed embodiments, a cross-point memory array efficiency of greater than 50% is achieved because the area or density of the memory blocks 406 on the first wafer 400 increases at a rate of N2, while the cost in terms of periphery area required, including the pitch of the pads 410 in the sockets 408, only increases at a rate of N.

Figure 6:
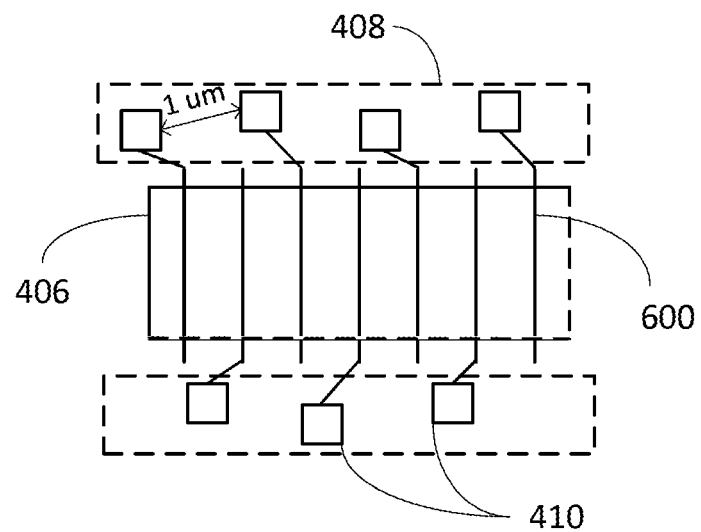
FIG. 6 is a top view of a portion of a memory block and a pair of adjacent sockets showing spacing of the pads in the sockets.

FIG. 6 is a top view of a portion of a memory block 406 and a pair of adjacent sockets 408 on opposite sides of the memory block 406 showing spacing of the pads 410 in the sockets 408. One set of conductive lines 600 representing word lines or bit lines is shown extending from the memory block 406 and connecting to the pads 410. The orthogonal set of conductive lines is not shown for clarity.

In the embodiment shown, the sockets 408 on the first wafer 400 comprise a first pair of sockets and a second pair of sockets associated with each of the memory blocks. The first pair of sockets is adjacent to first opposite sides (e.g., the top and bottom) of a corresponding memory block 406 is used to connect to the first set of conductive lines 600 (e.g., word lines). The second pair of sockets (not shown) is adjacent to second opposite sides (e.g. left and right sides) of the corresponding memory block 406 is used to connect to the second set of conductive lines (e.g., bit lines). In the 50×50 memory block embodiment, each of the sockets in the pair of sockets has 25 pads for a total of 50 pads.

In another embodiment, the sockets 408 on the first wafer 400 comprise a pair of sockets associated with each of the memory blocks, where one socket 408 in the pair connects to the first set of conductive lines (e.g., word lines) and the other socket 408 in the pair connects to the second set of conductive lines (e.g., bit lines). In the 50×50 memory block embodiment, each of the second sockets 408 in the pair would have 50 pads.

Although in one embodiment the conductive lines 600 may be spaced by 14 nm, the pads 410 in the sockets 408 are spaced a distance of at least one micron. The larger distance between the pads 410 is accomplished by fanning the pads out in the socket 408. In one embodiment, the sockets 408 on the wafer 400 have either a vertical orientation or a horizontal orientation but have a length greater than the length of the memory block to provide additional area for spaced pad distribution. In a further embodiment, the sockets 408 having a horizontal orientation have pads 410 arranged in a row, and neighboring pads in the row are staggered vertically from one another. Similarly, the sockets 408 having a vertical orientation have pads 410 arranged in a column, and neighboring pads in the column are staggered laterally from one another.

Referring again to FIGS. 5A and 5B, various operations will now be described in a method of fabricating an embedded cross-point memory in accordance with the embodiments disclosed herein. The process results in an embedded cross-point memory on the same chip as a processor without any wires or connections between the cross-point memory and the processor.

The cross-point memory array 404 is formed on top of the first wafer 400 using a first fabrication process, where the cross-point memory array 404 is fabricated as separate memory blocks 402 having a first plurality of sockets 408 located adjacent to the memory blocks 402. The sockets 408 are formed with a first plurality of pads 410 connected to word lines and bit lines of a corresponding memory block. In one embodiment, the pads 410 are fanned out at a pitch significantly greater than a pitch of the memory blocks 402. In one embodiment the pitch of the memory blocks 402 is less than 50 nm and the pitch of the first plurality of pads 410 is at least one micron.

Logic circuitry 416, including a processor, is formed on a second wafer 412 with a pitch of at least one micron using a second fabrication process that is different from the first fabrication process. In one embodiment, the logic circuitry comprises CMOS logic including silicon metal-oxide-semiconductor field-effect transistor (MOFETS).

A second plurality of sockets 418 on the second wafer 412 comprising a second plurality of pads 420 that are in positions on the second wafer 412 that align with positions of the first plurality of pads 408 on the first wafer, wherein a second pitch of the second plurality of pads 420 match the first pitch of the first plurality of pads 408.

In one embodiment, one of the first wafer 400 and the second wafer 412 is flipped and the first plurality of pads 408 is bonded to the second plurality of pads 420.

Once the first wafer 400 and the second wafer 412 are bonded, layers of silicon from a bottom of the first wafer 400 are optionally removed and reused to pattern another cross-point memory array.

Further details describing the structures disclosed herein are now provided. In an embodiment, memory material used for the memory element are composed of a material selected from the group 6 of Periodic Table alloyed with group 4, e.g., Ge, Si, and group 5, such as for example, Ge2Sb2Te5. In another embodiment, the memory material may include InxSbyTez hafnium oxide or a metal-doped hafnium oxide. In one such embodiment, a hafnium oxide material having a structural geometry that provides for a switchable polarization direction is used.

In an embodiment, electrode materials, such as materials for electrode layers 110/114 or 210/214 include a metal species such as, but not limited to, tungsten or platinum. In one embodiment, a selector material stack in series with the memory also consists of chalcogenide alloys, e.g., Se-based. Also metal nitride, such as a titanium nitride or a tantalum nitride layer, is used as the material for one or more of the electrode layers. In another embodiment, the one or more of the electrode layers are composed of a noble metal such as, but not limited to Pd or Pt. In an embodiment, interconnect lines, such as bit lines and word lines described above, are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines, such as bit lines and word lines described above, may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein are composed of or include a layer of a dielectric or insulating material. Examples of suitable dielectric materials include, but are not limited to, oxides of silicon (e.g., silicon dioxide (SiO2)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, array periphery devices, such as devices 108 or 208, are selector transistors. For example, in an embodiment, the selector transistors are metal-oxide semiconductor (MOS) transistors, or are bipolar transistors. In one embodiment, the selector transistors have a three-dimensional architecture, such as a trigate device, an independently accessed double gate device, or a FIN-FET.

In an embodiment, selector devices, such as selector devices 108 or 208, include a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

It is to be appreciated that the layers and materials described in association with embodiments herein are typically formed on or above an underlying semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated as or on underlying lower level back end of line (BEOL) interconnect layers.

In an embodiment, selector devices, such as selector devices 108 or 208, are fabricated as FEOL devices in or on a substrate. The substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in the bulk substrate is greater than 97%. In another embodiment, the bulk substrate is composed of an epitaxial layer grown atop a distinct crystalline substrate, e.g. a silicon epitaxial layer grown atop a boron-doped bulk silicon monocrystalline substrate. The bulk substrate may alternatively be composed of a group III-V material. In an embodiment, the bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, the bulk substrate is composed of a III-V material and the charge-carrier dopant impurity atoms are ones such as, but not limited to, carbon, silicon, germanium, oxygen, sulfur, selenium or tellurium.

Figure 7:
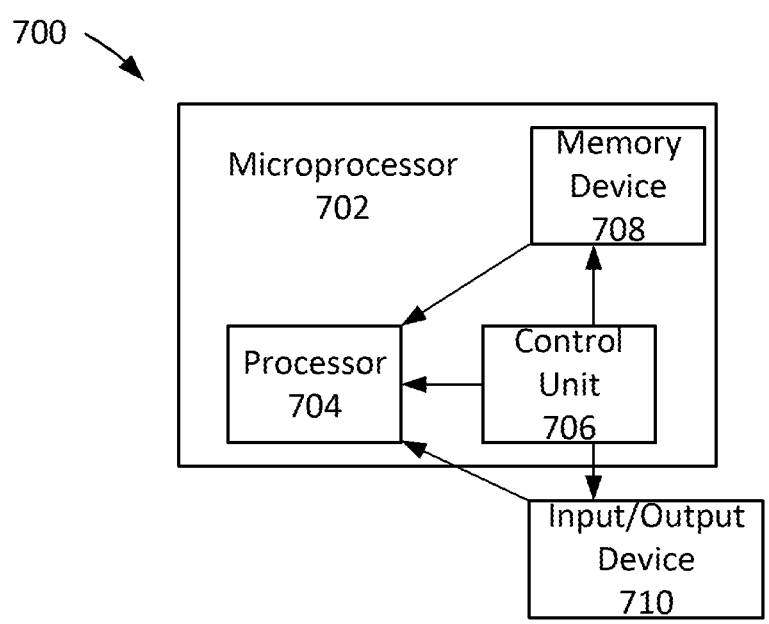
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be understood that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a memory element having a conductive oxide and electrode stack as described in the present description. In an embodiment, the memory device 708 is embedded in the microprocessor 702, as depicted in FIG. 7.

Figure 8:
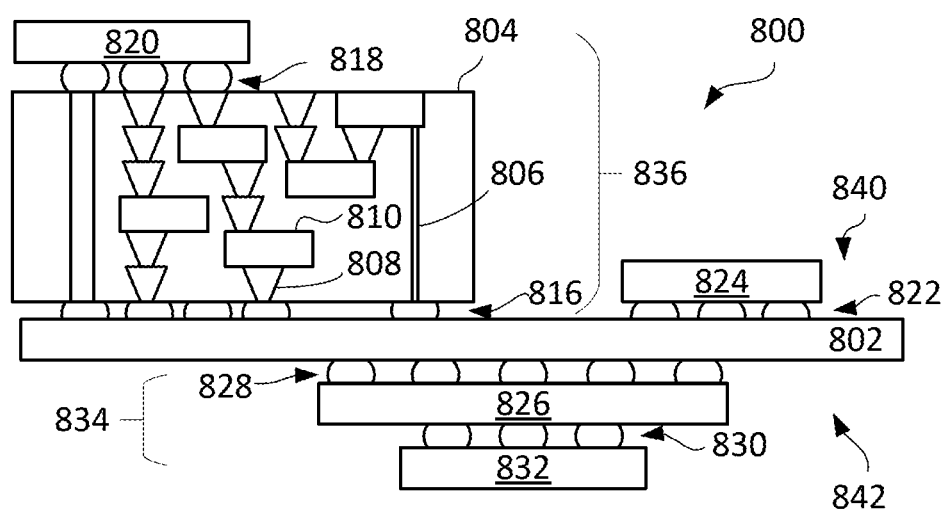
FIG. 8 is a cross-sectional side view of an integrated circuit (IC) device assembly that may include one or more embedded cross-point memory arrays, in accordance with one or more of the embodiments disclosed herein.

FIG. 8 is a cross-sectional side view of an integrated circuit (IC) device assembly that may include one or more embedded cross-point memory arrays, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of cross-point ferroelectric memory arrays 80 or 200 disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 8402 of FIG. 4B), an IC device, or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
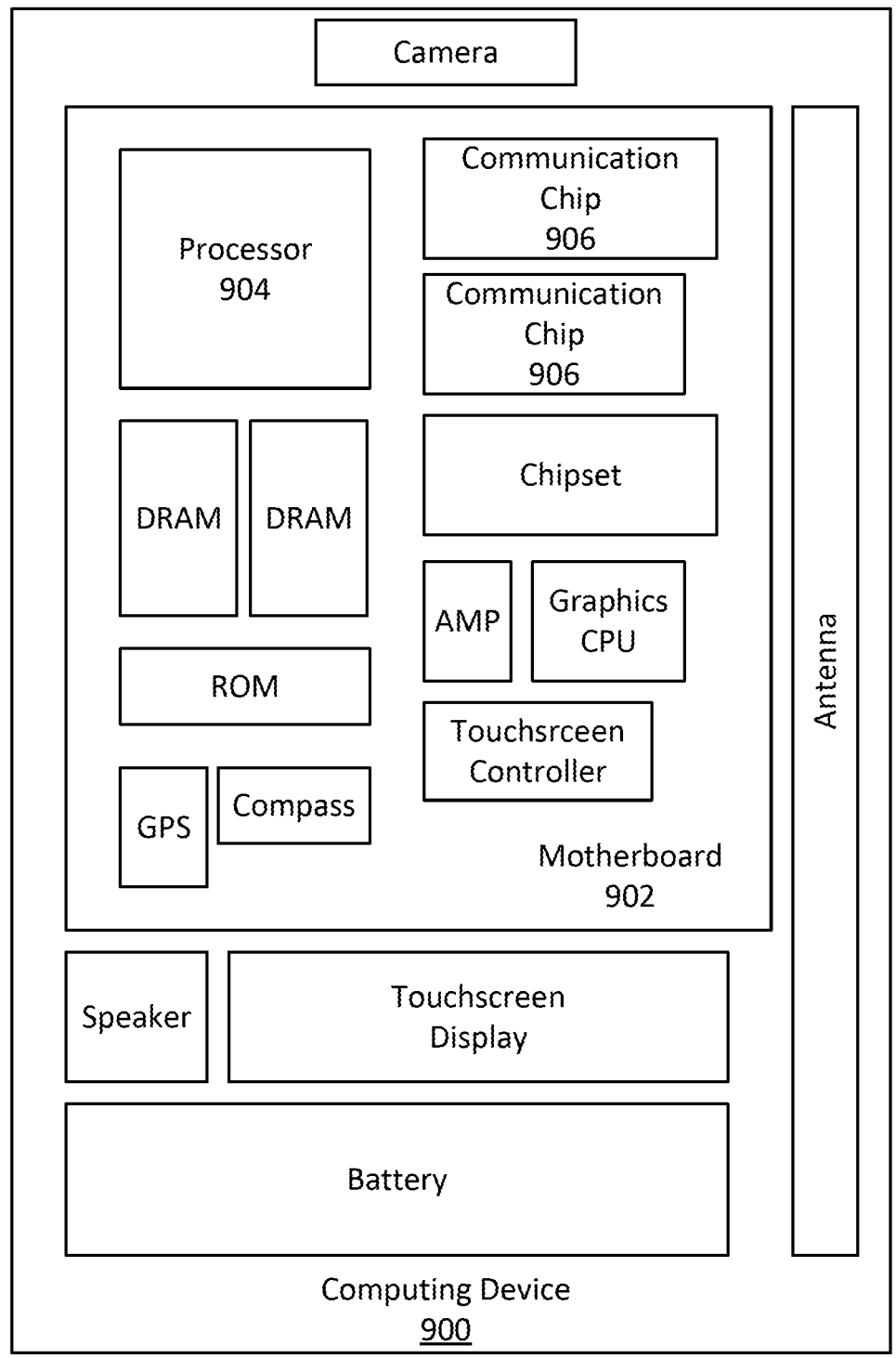
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 902.11 family), WiMAX (IEEE 902.16 family), IEEE 902.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes, or is electrically coupled with, one or more cross-point ferroelectric memory arrays, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the disclosure, the integrated circuit die of the communication chip includes, or is electrically coupled with, one or more cross-point ferroelectric memory arrays, in accordance with implementations of embodiments of the disclosure.

In further implementations, another component housed within the computing device 900 may contain an integrated circuit die that includes, or is electrically coupled with, one or more cross-point ferroelectric memory arrays, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Accordingly, one or more embodiments of the present disclosure relate generally to the fabrication of microelectronic memory. The microelectronic memory may be non-volatile, wherein the memory can retain stored information even when not powered. One or more embodiments of the present disclosure relate to the fabrication of a memory element having a conductive oxide and electrode stack for non-volatile microelectronic memory devices. Such an element may be used in an embedded non-volatile memory, either for its non-volatility, or as a replacement for embedded dynamic random access memory (eDRAM). For example, such an element may be used for, or in place of, 1T-1X memory (X=capacitor or resistor) at competitive cell sizes within a given technology node.

It is to be appreciated that not all aspects of the processes described above need be practiced to fall within the spirit and scope of embodiments of the present disclosure. Also, the processes described herein may be used to fabricate one or a plurality of integrated circuit devices.

Thus, embodiments described herein include embedded cross-point memory arrays, and methods of fabricating cross-point embedded memory arrays.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a first die including a cross-point memory array comprises separate memory blocks. The memory blocks include orthogonally arranged conductive lines and memory elements at cross-sections of the conductive lines. A first plurality of sockets is on the first die adjacent to sides the memory blocks, the first plurality of sockets comprising a first plurality of pads that connect to at least a portion of the conductive lines of the corresponding memory block. A second die includes logic circuitry and a second plurality of sockets comprising a second plurality of pads at least partially align with positions of the first plurality of pads on the first die. The top of the first die and a top of the second die face one another and wherein the first plurality of pads are bonded with the second plurality pads to directly connect the cross-point memory array to the logic circuitry.

Example Embodiment 2

The integrated circuit structure of example embodiment 1, wherein first plurality of pads are spaced at a pitch significantly greater than a pitch of the memory blocks.

Example Embodiment 3

The integrated circuit structure of example embodiment 2, wherein the pitch of the first plurality of pads matches a pitch of the logic circuitry and the second plurality of pads on the second die.

Example Embodiment 4

The integrated circuit structure of example embodiment 2 or 3, wherein the pitch of the memory blocks is less than 50 nm, and the pitches of the first plurality of pads, the logic circuitry and the second plurality of pads on the second die is at least one micron.

Example Embodiment 5

The integrated circuit structure of example embodiment 1, wherein the orthogonal conductive lines comprise word lines and bit lines, wherein each of the memory blocks include N word lines and M bit lines and a memory size of each of the memory blocks is N×M.

Example Embodiment 6

The integrated circuit structure of example embodiment 5, wherein N=M.

Example Embodiment 7

The integrated circuit structure of example embodiment 5 or 6, wherein N and M are both 50 to create 50×50 memory blocks.

Example Embodiment 8

The integrated circuit structure of example embodiment 5, 6, or 7, wherein a density of the memory blocks on the first die increases at a rate of N2, while the cost of the periphery area, including the pitch of the first plurality of pads in the first plurality of sockets increases at a rate of M achieving cross-point memory array efficiency of greater than 50%.

Example Embodiment 9

The integrated circuit structure of example embodiment 1, 2, 3, 4, 5, 6, 7, or 8, wherein the first plurality of sockets on the first die comprise a first pair of sockets and a second pair of sockets associated with corresponding memory blocks, wherein the first pair of sockets is adjacent to first opposite sides of the corresponding memory block and connects to a first set of conductive lines, and the second pair of sockets is adjacent to second opposite sides of the corresponding memory block and connects to a second set of conductive lines.

Example Embodiment 10

The integrated circuit structure of example embodiment 1, 2, 3, 4, 5, 6, 7, or 8, wherein the first plurality of sockets on the first die comprise a pair of sockets associated with corresponding ones of the memory blocks, wherein one socket in the pair connects to a first set of conductive lines, and the other socket in the pair connects to a second set of conductive lines.

Example Embodiment 11

The integrated circuit structure of example embodiment 1, 2, 3, 4, 5, 6, 7, 8, 9, or 10 wherein excess material from the first die is removed to create a carrier die that is used to pattern another cross-point memory array.

Example Embodiment 12

The integrated circuit structure of example embodiment 1, 2, 3, 4, 5, 6, 7, 8, 9, 10, or 11, wherein each of the first plurality of sockets has a length greater than a length of the memory blocks to provide additional area for spaced pad distribution.

Example Embodiment 13

The integrated circuit structure of example embodiment 1, 2, 3, 4, 5, 6, 7, 8, 9, 10, 11, or 12, wherein the first plurality of sockets have a horizontal orientation and have pads arranged in a row, and neighboring ones of the pads are staggered vertically from one another.

Example Embodiment 14

The integrated circuit structure of example embodiment 1, 2, 3, 4, 5, 6, 7, 8, 9, 10, 11, or 12, wherein the first plurality of sockets have a vertical orientation and have pads arranged in a column, and neighboring ones of the pads in the column are staggered laterally from one another.

Example Embodiment 15

An integrated circuit structure includes a first die including a cross-point memory array comprising separate memory blocks, the memory blocks including word lines and orthogonally arranges bit lines, and memory elements at cross-sections of the word lines and bit lines. A first plurality of sockets is on the first die adjacent to sides of the memory blocks, the first plurality of sockets comprising a first plurality of pads that connect to the word lines and bit lines of the corresponding memory block, wherein first plurality of pads are spaced at a first pitch significantly greater than that of the memory blocks. A second die including logic circuitry and a second plurality of sockets on the second die comprise a second plurality of pads at least partially aligned with positions of the first plurality of pads on the first die, wherein a second pitch of the second plurality of pads match the first pitch of the first plurality of pads. A top of the first die and a top of the second die face one another, and the first plurality of pads are bonded with the second plurality pads to directly connect the cross-point memory array to the logic circuitry.

Example Embodiment 16

The integrated circuit structure of example embodiment 15, wherein the first pitch of the first plurality of pads, and the second pitch of the second plurality of pads is at least one micron.

Example Embodiment 17

The integrated circuit structure of example embodiment 15 or 16, wherein the memory blocks include N word lines and M bit lines and a memory size of each of the memory blocks is N×M.

Example Embodiment 18

The integrated circuit structure of example embodiment 16, wherein N=M.

Example Embodiment 19

The integrated circuit structure of example embodiment 16, 17 or 18, wherein N and M are both 50 to create 50×50 memory blocks.

Example Embodiment 20

The integrated circuit structure of example embodiment 16, 17, 18, or 19, wherein a density of the memory blocks on the first die increases at a rate of N2, while the cost of the periphery area, including the pitch of the first plurality of pads in the first plurality of sockets increases at a rate of M achieving cross-point memory array efficiency of greater than 50%.

Example Embodiment 21

The integrated circuit structure of example embodiment 15, 16, 17, 18, 19 or 20, wherein the first plurality of sockets on the first die comprise a first pair of sockets and a second pair of sockets associated with corresponding memory blocks, wherein the first pair of sockets is adjacent to first opposite sides of the corresponding memory block and connects to a first set of conductive lines, and the second pair of sockets is adjacent to second opposite sides of the corresponding memory block and connects to a second set of conductive lines.

Example Embodiment 22

The integrated circuit structure of example embodiment 15, 16, 17, 18, 19, or 20, wherein the first plurality of sockets on the first die comprise a pair of sockets associated with corresponding memory blocks, wherein one socket in the pair connects to a first set of conductive lines, and the other socket in the pair connects to a second set of conductive lines.

Example Embodiment 23

The integrated circuit structure of example embodiment 15, 16, 17, 18, 19, 20, 21 or 22, wherein excess material from the first die is removed to create a carrier die that is used to pattern another cross-point memory array.

Example Embodiment 24

A method of fabricating an embedded cross-point memory includes forming a cross-point memory array on a top of a first die using a first fabrication process, wherein the cross-point memory array is fabricated as separate memory blocks having a first plurality of sockets located adjacent to the memory blocks, each of the a first plurality of sockets having a first plurality of pads connected to word lines and bit lines of a corresponding memory block. Logic circuitry, including a processor, is formed on a second die with a pitch of at least one micron using a second fabrication process that is different from the first fabrication process. A second plurality of sockets is formed on the second die comprising a second plurality of pads at least partially aligned with positions of the first plurality of pads on the first die, wherein a second pitch of the second plurality of pads match the first pitch of the first plurality of pads. The first plurality of pads is bonded to the second plurality of pads. Layers of silicon are optionally removed from a bottom of the first die and the layers of silicon are reused to pattern another cross-point memory array.

Example Embodiment 25

The method of fabricating an array of vertical width thin film transistors of example embodiment 24, further comprising forming the first plurality of pads with a pitch significantly greater than a pitch of the memory blocks.

What is claimed is:

1. An integrated circuit structure, comprising:
   a first die including a cross-point memory array comprising separate memory blocks, the memory blocks including orthogonally arranged conductive lines and memory elements at cross-sections of the conductive lines;
   a first plurality of sockets on the first die adjacent to sides of the memory blocks, the first plurality of sockets comprising a first plurality of pads that connect to at least a portion of the conductive lines of the corresponding memory block;
   a second die including logic circuitry; and
   a second plurality of sockets on the second die comprising a second plurality of pads at least partially aligned with positions of the first plurality of pads on the first die;
   wherein a top of the first die and a top of the second die face one another, and wherein the first plurality of pads are bonded with the second plurality pads to directly connect the cross-point memory array to the logic circuitry.

2. The integrated circuit structure of claim 1, wherein first plurality of pads are spaced at a pitch significantly greater than a pitch of the memory blocks.

3. The integrated circuit structure of claim 2, wherein the pitch of the first plurality of pads matches a pitch of the logic circuitry and the second plurality of pads on the second die.

4. The integrated circuit structure of claim 2, wherein the pitch of the memory blocks is less than 50 nm, and the pitches of the first plurality of pads, the logic circuitry and the second plurality of pads on the second die is at least one micron.

5. The integrated circuit structure of claim 1, wherein the conductive lines comprise word lines and bit lines, wherein each of the memory blocks include N word lines and M bit lines and a memory size of each of the memory blocks is N×M.

6. The integrated circuit structure of claim 5, wherein N=M.

7. The integrated circuit structure of claim 5, wherein N and M are both 50 to create 50.times.50 memory blocks.

8. The integrated circuit structure of claim 5, wherein a density of the memory blocks on the first die increases at a rate of $N^2$, while the cost of the periphery area, including the pitch of the first plurality of pads in the first plurality of sockets increases at a rate of M achieving cross-point memory array efficiency of greater than 50%.

9. The integrated circuit structure of claim 1, wherein the first plurality of sockets on the first die comprise a first pair of sockets and a second pair of sockets associated with corresponding memory blocks, wherein the first pair of sockets is adjacent to first opposite sides of the corresponding memory block and connects to a first set of conductive lines, and the second pair of sockets is adjacent to second opposite sides of the corresponding memory block and connects to a second set of conductive lines.

10. The integrated circuit structure of claim 1, wherein the first plurality of sockets on the first die comprise a pair of sockets associated with corresponding ones of the memory blocks, wherein one socket in the pair connects to a first set of conductive lines, and the other socket in the pair connects to a second set of conductive lines.

11. The integrated circuit structure of claim 1, wherein excess material from the first die is removed to create a carrier die that is used to pattern another cross-point memory array.

12. The integrated circuit structure of claim 1, wherein each of the first plurality of sockets has a length greater than a length of the memory blocks to provide additional area for spaced pad distribution.

13. The integrated circuit structure of claim 12, wherein the first plurality of sockets have a horizontal orientation and have pads arranged in a row, and neighboring ones of the pads are staggered vertically from one another.

14. The integrated circuit structure of claim 12, wherein the first plurality of sockets have a vertical orientation and have pads arranged in a column, and neighboring ones of the pads in the column are staggered laterally from one another.

15. An integrated circuit structure, comprising:
   a first die including a cross-point memory array comprising separate memory blocks, the memory blocks including word lines and orthogonally arranged bit lines, and memory elements at cross-sections of the word lines and bit lines;
   a first plurality of sockets on the first die adjacent to sides of the memory blocks, the first plurality of sockets comprising a first plurality of pads that connect to the word lines and bit lines of the corresponding memory block, wherein first plurality of pads are spaced at a first pitch significantly greater than that of the memory blocks;
   a second die including logic circuitry; and
   a second plurality of sockets on the second die comprising a second plurality of pads at least partially aligned with positions of the first plurality of pads on the first die, wherein a second pitch of the second plurality of pads match the first pitch of the first plurality of pads;
   wherein a top of the first die and a top of the second die face one another, and wherein the first plurality of pads are bonded with the second plurality pads to directly connect the cross-point memory array to the logic circuitry.

16. The integrated circuit structure of claim 15, wherein the first pitch of the first plurality of pads, and the second pitch of the second plurality of pads is at least one micron.

17. The integrated circuit structure of claim 15, wherein the memory blocks include N word lines and M bit lines and a memory size of each of the memory blocks is N×M.

18. The integrated circuit structure of claim 17, wherein N=M.

19. The integrated circuit structure of claim 17, wherein N and M are both 50 to create 50×50 memory blocks.

20. The integrated circuit structure of claim 17, wherein a density of the memory blocks on the first die increases at a rate of $N^2$, while the cost of the periphery area, including the pitch of the first plurality of pads in the first plurality of sockets increases at a rate of M achieving cross-point memory array efficiency of greater than 50%.

21. The integrated circuit structure of claim 15, wherein the first plurality of sockets on the first die comprise a first pair of sockets and a second pair of sockets associated with corresponding memory blocks, wherein the first pair of sockets is adjacent to first opposite sides of the corresponding memory block and connects to a first set of conductive lines, and the second pair of sockets is adjacent to second opposite sides of the corresponding memory block and connects to a second set of conductive lines.

22. The integrated circuit structure of claim 15, wherein the first plurality of sockets on the first die comprise a pair of sockets associated with corresponding memory blocks, wherein one socket in the pair connects to a first set of conductive lines, and the other socket in the pair connects to a second set of conductive lines.

23. The integrated circuit structure of claim 15, wherein excess material from the first die is removed to create a carrier die that is used to pattern another cross-point memory array.

24. A method of fabricating an embedded cross-point memory, the method comprising:

forming a cross-point memory array on a top of a first die using a first fabrication process, wherein the cross-point memory array is fabricated as separate memory blocks having a first plurality of sockets located adjacent to the memory blocks, each of the a first plurality of sockets having a first plurality of pads connected to word lines and bit lines of a corresponding memory block;

forming logic circuitry, including a processor, on a second die with a pitch of at least one micron using a second fabrication process that is different from the first fabrication process;

forming a second plurality of sockets on the second die comprising a second plurality of pads at least partially aligned with positions of the first plurality of pads on the first die, wherein a second pitch of the second plurality of pads match the first pitch of the first plurality of pads;

bonding the first plurality of pads to the second plurality of pads; and optionally removing layers of silicon from a bottom of the first die and reusing the layers of silicon to pattern another cross-point memory array.

25. The method of claim 24, further comprising forming the first plurality of pads with a pitch significantly greater than a pitch of the memory blocks.

* * * * *